United States Patent [19]

Sminchak et al.

[11] Patent Number: 5,546,008
[45] Date of Patent: Aug. 13, 1996

[54] INFLATABLE CAPACITANCE MEASURING DEVICE

[75] Inventors: Michael D. Sminchak, Clifton Park; James M. Anderson, Cohoes, both of N.Y.

[73] Assignee: General Electric Co., Schenectady, N.Y.

[21] Appl. No.: 289,488

[22] Filed: Aug. 11, 1994

[51] Int. Cl.⁶ ............................ G01R 27/26; G01R 31/06
[52] U.S. Cl. .......................... 324/690; 324/551; 324/661; 324/663
[58] Field of Search .................................... 324/537, 545, 324/551, 555, 661, 662, 663, 664, 690, 772

[56] References Cited

U.S. PATENT DOCUMENTS

| | | | |
|---|---|---|---|
| 4,482,860 | 11/1984 | Risko | 324/690 |
| 4,668,912 | 5/1987 | Junker | 324/220 |
| 4,841,224 | 6/1989 | Chalupnik et al. | 324/609 |
| 5,070,302 | 12/1991 | Marcus et al. | 324/690 |

FOREIGN PATENT DOCUMENTS 1148004A  3/1985  U.S.S.R. ................. 324/545

*Primary Examiner*—Kenneth A. Wieder
*Assistant Examiner*—Glenn W. Brown
*Attorney, Agent, or Firm*—Nixon & Vanderhye

[57] ABSTRACT

A capacitance test device has been developed for measuring the capacitance of the insulation wrap on armature bars in electromagnetic generators and motors. The test device comprises a probe having an electrode plate mounted on an inflatable bladder. The plate is formed of an elastomeric conductive material and is sufficiently flexible to make good surface contact with the insulation on an armature bar. The plate is electrically connected to a capacitance meter that is also coupled to ground as are the armature bars during testing. The bladder is initially deflated to reduce the thickness of the test device so that the device can be slid into the narrow gap between the insulated armature bars of a stator. Once positioned between the bars, the bladder is inflated with a pressure hose to press the electrode plate firmly against the surface of the insulation of the armature bar. Once the capacitance of the insulation has been measured, the bladder is deflated with the aid of a vacuum pump to minimize the width of the probe.

11 Claims, 4 Drawing Sheets

INFLATABLE CAPACITANCE MEASURING DEVICE

FIELD OF THE INVENTION

This invention relates to the testing of power generators and motors and, more particularly, to the inspection and capacitance testing of insulation on armature windings in generators and motors.

BACKGROUND AND SUMMARY OF THE INVENTION

In large industrial motors and generators, the armature windings, also known as stator windings, are inspected from time to time to confirm that they are operating properly. Each armature winding includes a conductive armature bar(s) wrapped in layers of insulation. The insulation confines the voltage in the bars to prevent arcing between windings, and shields the bars against stray objects that could electrically short the bars and to protect people and equipment. In view of the high voltage levels that are present in industrial generators and motors, the insulation on armature bars must provide an effective and complete barrier surrounding the bars. If the insulating properties of the insulation degrades because it becomes damp or for other reasons, then voltage arcs may jump from the armature bars through degraded regions of the insulation to cause electrical shorts that can harm people and damage equipment.

The insulation on armature windings are inspected from time to time to determine whether the insulation has degraded and, if so, to what extent. The dielectric constant of an insulator provides a measure of its insulating properties. Accordingly, the insulation of an armature winding can be inspected by determining the dielectric constant of the insulation. The dielectric constant of the insulator can be calculated by measuring the capacitance of the insulation on the armature bars. The dielectric constant indicates such conditions as the amount of dampness in the insulator. A damp insulator may indicate that leak in the water passages in a water cooled armature. A damp insulator may be water damaged and not functioning as an effective insulator.

All insulating materials have a dielectric constant, which is a measure of the amount of energy the insulating material stores when a voltage is applied across the material. The dielectric constant for air is 1.0, for Micapal, a common insulation material for armature windings, is approximately 4, and 80 for water. Because of the large difference in the dielectric constants for Micapal (and other winding insulators) and water, the dielectric constant changes relatively dramatically when an insulator for a winding becomes damp. Accordingly, measuring the dielectric constant of an insulator provides an effective means for detecting water logged insulation on stator windings.

The dielectric constant for an armature insulator can be calculated using capacitance values measured across the insulator. Capacitance and the dielectric constant are related as described in the following equation:

$C = kDA/t$

Where:
D=dielectric constant of the insulation
A=area of the probe electrode
t=thickness of the insulation Because the area (A) of a probe electrode and thickness (t) of the insulator are know quantities and the capacitance (C) of the insulator is a measured quantity, the dielectric constant (D) can be relatively easily calculated with the above equation.

The capacitance of the insulation of an armature winding is usually measured at the ends of the windings. Armature windings are generally mounted in longitudinal slots in a cylindrical stator and the windings have ends that extend out from both ends of the stator. At their ends, the armature windings are relatively exposed and accessible to measurement probes. However, there are generally a large number of armature windings that are tightly nested together at the ends of the stator. The gap between adjacent armature windings is often narrow, and the gap can be as small as 0.25 inch or smaller. Because of the narrow gap between armature windings, it has for a long time been very difficult to insert capacitance probes between the windings. In addition, the narrow gaps make it difficult for the probe to form a good electrical surface contact with the surface of the insulation. Without a good surface contact, air in gaps between the probe and the surface of the insulation can distort the capacitance measurement. Accordingly, the narrow gap between armature windings poses long-standing problems for capacitance probes.

In the past, capacitance probes have been formed from foam pads wrapped in metal foil, where the foil is used as an electrode to measure the capacitance of the armature insulation. The wrapped foam pad is attached to a paddle that is used to hold the pad against the armature insulation. The large relative thickness of the foam pad and paddle probe limits this technique to situations where there is a relatively large gap between adjacent armature windings. Alternatively, electrodes for capacitance probes have been formed of adhesive metal tape that adheres to the armature insulation. However, even with metal tape a wide gap between windings is needed for the technician to apply and remove the metal tape. The metal tape has an additional disadvantage of tearing and leaving metal strips on the surface of the winding that can cause a short in the motor or generator. Another probe has been proposed that is comprised of a brass plate electrode having an inclined plane back surface that slides up a matching incline plane in the probe. Before the inclined planes slide over one another, the probe is relatively narrow and is inserted between armature windings. The brass electrode is pressed against the surface of the armature insulation by sliding one of the inclined planes against the other plane to expand the thickness of the probe. This inclined plane electrode also does not fit in the small gaps between many of the electrodes in current stators. Accordingly, there has been a long felt need for a capacitance test device having a probe that can slide between the narrow gap between the armature windings and establish good surface contact with the insulation.

To satisfy the need for a thin capacitance probe, the current invention was developed to measure the capacitance of the insulation wrap on armature bars in electromagnetic generators and motors. The test device comprises a probe having an electrode plate mounted on an inflatable bladder. The plate is formed of an elastomeric conductive material and is sufficiently flexible to make good surface contact with the insulation on an armature bar. The plate is electrically connected to a capacitance meter that is also coupled to ground as are the armature bars during testing. The bladder is initially deflated to reduce the thickness of the test device so that the device can be slid into the narrow gap between the insulated armature bars of a stator. Once positioned between the bars, the bladder is inflated with a pressure hose to press the electrode plate firmly against the surface of the insulation of the armature bar. Once the capacitance of the insulation has been measured, the bladder can be deflated with the aid of a vacuum pump to minimize the thickness of the probe.

It is an object of the current invention to measure the capacitance of the insulation on armature bars in electromagnetic motors and generators. It is a further object of the invention to provide a probe for measuring capacitance that is initially thin for insertion between closely spaced stator windings and expandable to provide a good electrical connection between the probe and the insulation being measured. It is another object of the invention for the probe to be easy to use, reliable in its operation and resistive to oils and other chemicals that commonly exist on and near operating electromagnetic machines. These objects and more have been satisfied with the current invention which is described in detail in the following detailed written description and attached drawings.

BRIEF DESCRIPTION OF THE DRAWINGS

The attached figures illustrate embodiments of the invention and these figures are.

DETAILED DESCRIPTION OF THE DRAWINGS

Figure 1:
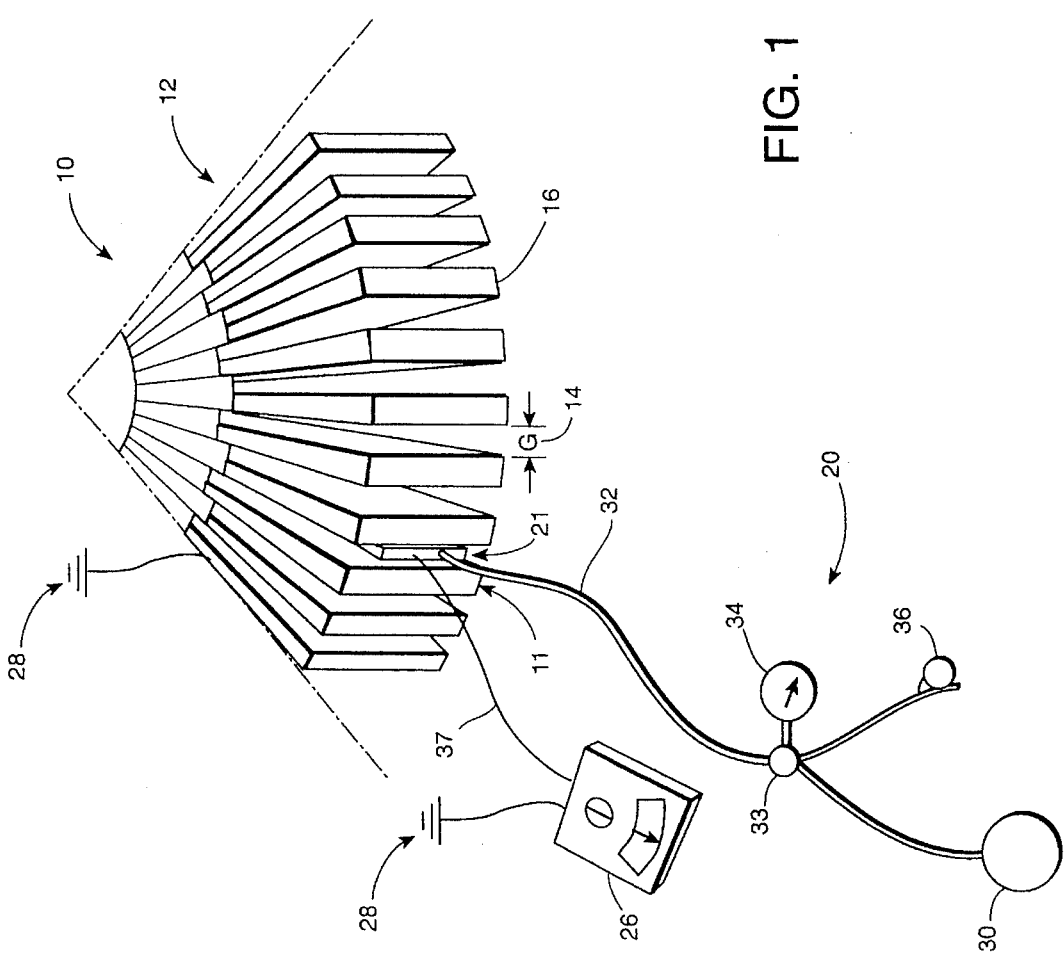
FIG. 1 shows a perspective view of a quarter section of an end of stator in a generator or motor.

FIG. 1 shows an end view of a stator 10 for an electromechanical motor or generator. Only a quarter section of the stator is shown in the figure, and the rotor and other associated components of the motor or generator have been omitted for purposes of illustration only. In normal operation, the capacitance test device 20 of the present invention is used with a fully assembled motor or generator. The test device 20 is slid between the ends 11 of a pair of adjacent armature windings 12 that extend from the cylindrical stator 10. These ends of the armature windings are nested closely together and only have a small gap (G) 14 between adjacent windings. Indeed, this gap (G) is generally less than 1 inch and typically in the range of 0.75 inch to 0.25 inch. By way of comparison, the individual armature bars 16 have a width of typically between 1.0 to 3.0 inches and a thickness of 1.0 to 3.0 inches. To measure the capacitance of the insulation coveting of the armature windings, the probe 21 of the test device 20 must slide in this gap (G) between adjacent armature windings.

Figure 2:
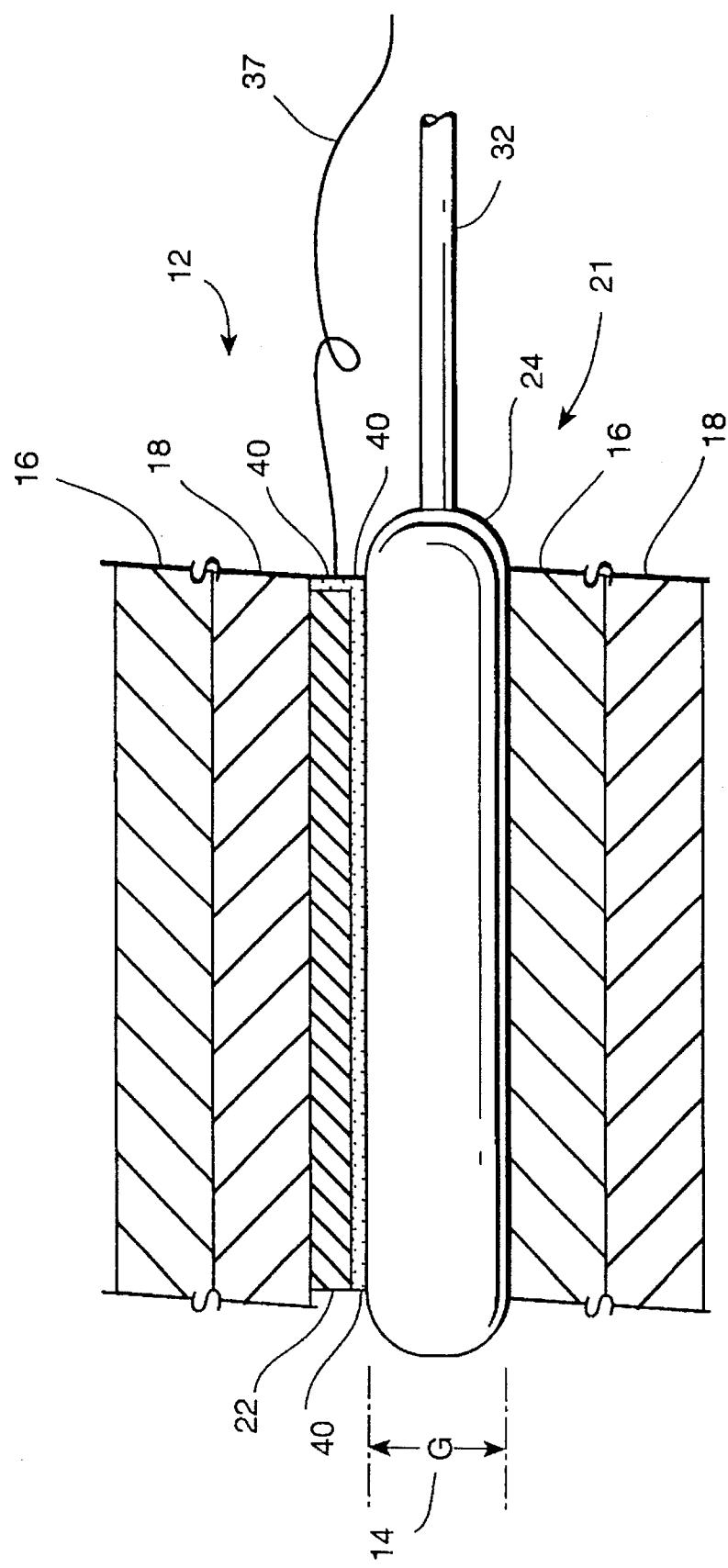
FIG. 2 is a cross-section of a first embodiment of the invention inserted between an adjacent pair of stator windings.
Figure 3:
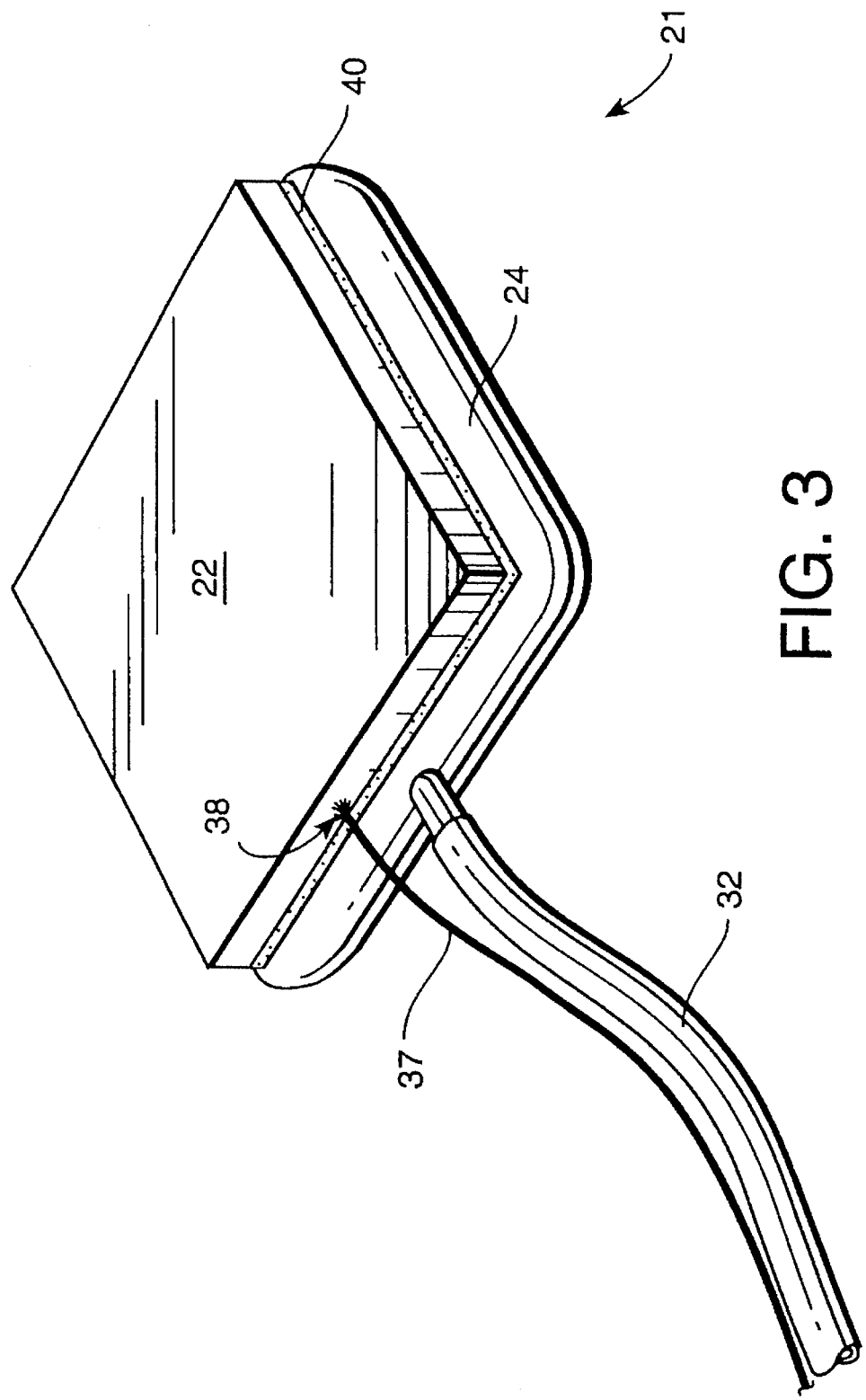
FIG. 3 is a perspective view of the first embodiment of the invention shown in FIG. 2.

As shown in FIGS. 1 to 3, the test probe 21 includes an electrode pad 22 mounted on a rectangular bladder 24. The pad is electrically coupled to an electrical meter 26 for measuring capacitance, such as a capacitance bridge or a capacitance meter, that measures the capacitance between the pad and a common ground 28. Since the armature bars 16 of the windings are also grounded, the meter measures the capacitance across the insulation layer 18 surrounding of the respective armature bar of the stator. In addition, the meter may be included or connected to a computer, e.g., a lap-top computer, to log measurements and calculate the dielectric constant of the insulation. The bladder 24 of the test probe 21 is coupled to an air pump 30 via an air hose 32.

The air pump may be as simple as a hand activated rubber bulb or more complex, such as a compressor or other source of pressurized air. A regulator 33 coupled to the air hose may be used in conjunction with a high pressure source to reduce the air pressure applied to the bladder, such as to a level less than 10 psi and preferably to about 4 psi. A pressure gauge 34 is connected to the hose or bladder to indicate the air pressure in the bladder. In addition, the air compressor may have an associated vacuum pump 36 to draw air out of the bladder and thereby compress the bladder to its minimum size for insertion and removal from between the armature windings. In addition, the bladder is disclosed here as being air filled, but other fluids, such as water, inert gases, etc., may be equally suitable for filling the bladder.

The electrode pad 22 may be a rectangular pad, e.g., about 1 inch by 2 inch by 0.125 inch, that is preferably formed of an electrically conductive elastomeric material, such as an electrically conductive silicone. The flexibility of the electrode pad allows it to conform to an irregular surface of insulation 18 for the armature winding. By conforming to the insulation surface, the electrode pad provides good electrical contact with the insulation and purges air packets from between the pad and insulation that can distort the capacitance measurements. In addition, the electrode pad is pressed against the insulation surface in a uniform manner as the pressure increases in the air bladder 24.

An electrical lead wire 37 connects the capacitance meter 26 to the electrode plate. The wire, e.g., no. 12 stranded wire, may be formed of several conductive strands covered by an plastic sheath. At the end 38 of the wire near the electrode pad, the conductive strands are fanned apart and conductively attached to the pad, preferably to the side of the plate adjacent the bladder 24.

The electrode pad is glued to the bladder with an epoxy cement and a fillet 40 is formed between the plates edges and the bladder. The bladder is formed of an elastomer material that is resistant to oil and other contaminants, such as silicone rubber or Viton fluoroelastomer. In one example, the bladder is approximately 2 inches square and 0.125 inches thick before inflation. The dimensions of the electrode pad and bladder are to be selected depending upon the particular type of stator which is to be measured by the measuring device. Indeed, it may be desirable to have available two or more plate/bladder probes 21 of different sizes so that a technician can select the best probe for each particular capacitance measurement.

Figure 4:
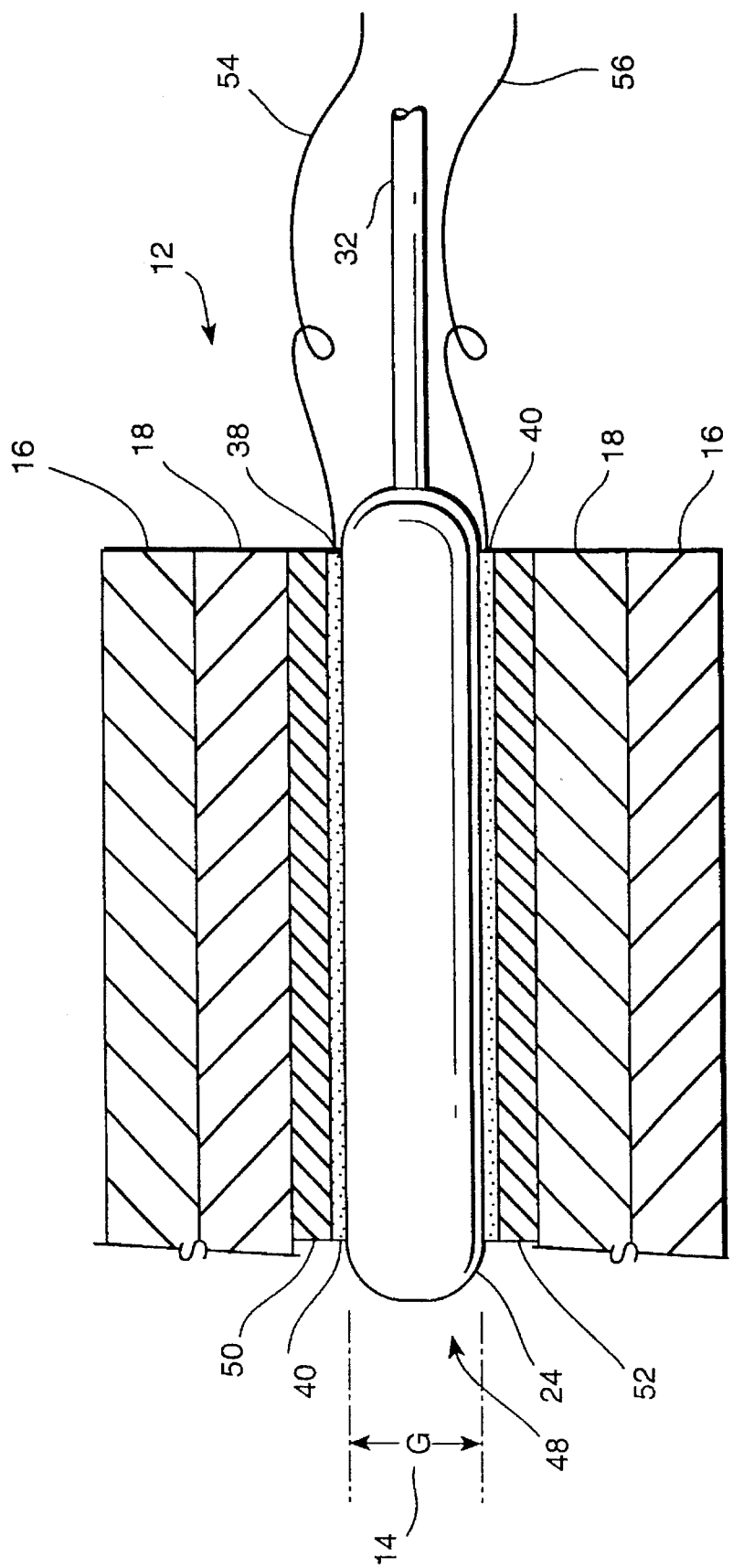
FIG. 4 is a cross section of a second embodiment of the invention inserted between an adjacent pair of stator windings.

In an alternative embodiment 48 shown in FIG. 4, an air bladder 24 has two electrode pads 50, 52 on opposite sides of the bladder. These electrodes each have respective electrical leads 54, 56 that connect both electrode pads to a capacitance meter. This alternative embodiment allows capacitance measurements to be made on two adjacent windings without having to move the test device 48.

The invention has been described in what is presently considered to be the most practical and preferred embodiments. The invention is not limited to the disclosed embodiments. Rather, the invention covers various modifications and equivalent arrangements included within the spirit and scope of the appended claims.

What is claimed is:

1. A test device for measuring a dielectric constant of a section of insulation in armature windings of motors or generators comprising:

a thin probe including a conductive electrode pad mounted on an expandable bladder, said pad having a flexible contact surface adapted to conform to a surface area of the section of insulation, and said pad adapted to be coupled to a voltage source;

a capacitance measuring instrument electrically coupled to the electrode pad and adapted to be coupled to a ground common to the armature windings, where said instrument measures local capacitance across a portion of the insulation adjacent the electrode pad;

a source of fluid under pressure coupled to the bladder such that said bladder expands under the pressure of the fluid when coupled to the source of fluid, and a drain coupled to the bladder to drain fluid from the bladder to deflate the bladder.

2. A probe for a test device as in claim 1 wherein the bladder is filled with air and the fluid source is a source of pressurized air.

3. A probe for a test device as in claim 1 wherein said bladder is a nonconductive, elastomer material that is resistant to oil.

4. A probe for a test device as in claim 1 wherein said electrode pad is a conductive elastomeric material.

5. A probe for a test device as in claim 4 wherein said pad is rectangular in shape has a thickness of no greater than 0.25 inches.

6. A probe for a test device as in claim 1 wherein said bladder is adapted to be coupled to a vacuum source to deflate the bladder and thereby reduce the thickness of the bladder from an expanded state of the bladder.

7. A probe as in claim 1 wherein the electrode pad is a first pad and further comprising a second electrode pad mounted on a side of the bladder opposite to a side of the bladder on which the first pad is mounted.

8. A method for measuring the capacitance across a section of insulation in an armature winding of a motor or generator using a probe having an electrode pad attached to an inflatable bladder, wherein said method comprises the steps of:

a. inserting the probe between a pair of adjacent armature windings while the bladder is deflated;

b. inflating the bladder to press the electrode pad firmly against a surface of the section of insulation of the armature winding, such that the pad conforms to the surface of insulation;

c. measuring the capacitance across the section of the insulation adjacent the electrode pad by applying a voltage to the pad and using an instrument electrically coupled to the electrode pad and a ground common to the armature winding;

d. deflating the bladder after completing the measurement, and e. removing the probe from between the armature after deflating the bladder.

9. A method as in claim 8 wherein step (d) is practiced by attaching vacuum source to the bladder.

10. A method as in claim 8 wherein step (c) is practiced by measuring the capacitance across the insulation in a first armature winding with a first electrode pad and by measuring the capacitance across the insulation on a second armature winding, adjacent to the first, with a second electrode pad, wherein the first and second electrode pads are mounted on opposite sides of the bladder.

11. A method as in claim 8, wherein step (a) is practiced by inserting the bladder between a pair of adjacent end turns of the armature windings.

* * * * *